(12) United States Patent
Cok et al.

(10) Patent No.: US 7,791,271 B2
(45) Date of Patent: Sep. 7, 2010

(54) TOP-EMITTING OLED DEVICE WITH LIGHT-SCATTERING LAYER AND COLOR-CONVERSION

(75) Inventors: Ronald S. Cok, Rochester, NY (US); Andrew D. Arnold, Hilton, NY (US); Mitchell S. Burberry, Webster, NY (US)

(73) Assignee: Global OLED Technology LLC, Wilmington, DE (US)

( * ) Notice: Subject to any disclaimer, the term of this patent is extended or adjusted under 35 U.S.C. 154(b) by 1205 days.

(21) Appl. No.: 11/361,089

(22) Filed: Feb. 24, 2006

(65) Prior Publication Data
US 2007/0200492 A1 Aug. 30, 2007

(51) Int. Cl.
H01L 51/00 (2006.01)
H01L 51/50 (2006.01)
H01L 51/52 (2006.01)

(52) U.S. Cl. ..................................... 313/506
(58) Field of Classification Search ....................... None
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 5,955,837 A | 9/1999 | Horikx et al. | |
| 6,392,340 B2 | 5/2002 | Yoneda et al. | |
| 6,731,359 B1 | 5/2004 | Fukaya | |
| 6,777,871 B2 | 8/2004 | Duggal et al. | |
| 6,787,796 B2 | 9/2004 | Do et al. | |
| 6,809,781 B2 * | 10/2004 | Setlur et al. | 349/70 |

| | | |
|---|---|---|
| 2001/0026124 A1 | 10/2001 | Liu et al. |
| 2004/0061136 A1 | 4/2004 | Tyan et al. |

(Continued)

FOREIGN PATENT DOCUMENTS

WO WO 02/37568 5/2002

(Continued)

OTHER PUBLICATIONS

U.S. Appl. No. 11/361,488, filed Feb. 24, 2006, titled *OLED Device Having Improved Light Output* by Ronald S. Cok et al.

(Continued)

*Primary Examiner*—Toan Ton
*Assistant Examiner*—Britt D Hanley
(74) *Attorney, Agent, or Firm*—Morgan Lewis & Bockius LLP

(57) ABSTRACT

A top-emitting OLED device, comprising: one or more OLEDs formed on a substrate; a light-scattering layer formed over the one or more OLEDs; a transparent cover; one or more color filters formed on the transparent cover; a color-conversion material layer formed over the color filters, or formed over or integral with the light-scattering layer; wherein the substrate is aligned and affixed to the transparent cover so that the locations of the color filters and color conversion material correspond to the location of the OLEDs, and the color-conversion material layer, color filters, and the light-scattering layer are between the cover and substrate, and a low-index gap is formed between the light-scattering layer and the color filters, with no light-scattering layer being positioned between the color conversion material layer and the low-index gap.

2 Claims, 6 Drawing Sheets

U.S. PATENT DOCUMENTS

| | | | |
|---|---|---|---|
| 2004/0217702 | A1 | 11/2004 | Garner et al. |
| 2004/0233139 | A1 | 11/2004 | Asano et al. |
| 2005/0018431 | A1 | 1/2005 | Shiang |
| 2005/0057177 | A1 | 3/2005 | Lu et al. |
| 2005/0116621 | A1 | 6/2005 | Bellmann et al. |
| 2005/0142379 | A1 | 6/2005 | Juni et al. |
| 2005/0194896 | A1 | 9/2005 | Sugita |
| 2005/0208332 | A1* | 9/2005 | Chin et al. .......... 428/690 |

FOREIGN PATENT DOCUMENTS

WO      WO 02/37580      5/2002

OTHER PUBLICATIONS

U.S. Appl. No. 11/361,094, filed Feb. 24, 2006, titled *Light-Scattering Color-Conversion Material Layer* by Ronald S. Cok et al.

C. W. Tang et al; "Organic Electroluminescent Diodes"; Applied Physics Letters; vol. 51; No. 12; Sep. 12, 1987; pp. 913-915.

C. W. Tang et al; "Electroluminescence of Doped Organic Thin Films"; Journal of Applied Physics; vol. 65; No. 9; May 1, 1989; pp. 3610-3616.

A. N. Safonov et al; "Modification of Polymer Light Emission by Lateral Microstructure"; Synthetic Metals; 116; 2001; pp. 145-148.

John M. Lupton et al; "Bragg Scattering From Periodically Microstructured Light Emitting Diodes"; Applied Physics Letters; vol. 77; No. 21; Nov. 20, 2000; pp. 3340-3342.

Tetsuo Tsutsui et al; "Sharply Directed Emission in Organic Electroluminescent Diodes With An Optical-Microcavity Structure"; Applied Physics Letters; vol. 65; No. 15; Oct. 10, 1994; pp. 1868-1870.

Amalkumar P. Ghosh et al; U.S. Appl. No. 11/095,166, filed Mar. 31, 2005; titled "Reducing Angular Dependency in Microcavity Color OLEDS".

Ronald S. Cok et al; U.S. Appl. No. 11/065,082, filed Feb. 24, 2005; titled "OLED Device Having Improved Light Output".

\* cited by examiner

TOP-EMITTING OLED DEVICE WITH LIGHT-SCATTERING LAYER AND COLOR-CONVERSION

FIELD OF THE INVENTION

The present invention relates to OLED devices, and more particularly, to top-emitter OLED devices having improved efficiency and reduced manufacturing costs.

BACKGROUND OF THE INVENTION

Flat-panel display devices employ a variety of technologies for emitting patterned, colored light to form full-color pixels. Some of these technologies employ a common light-emitter for all of the color pixels and color-conversion materials to convert the light of the common light-emitter into colored light of the desired frequencies. Such unpatterned, common light-emitters may be preferred since patterning colored emitters can be difficult. For example, liquid crystal displays (LCDs) typically employ a backlight that relies on either fluorescent tubes to emit a white light or a set of differently colored, inorganic light-emitting diodes to emit white light together with patterned color filters, for example red, green, and blue, to create a full-color display. It is also known to employ the differently colored light-emitting diodes in the set sequentially to create a series of colored backlights in which case color filters may not be necessary. Alternatively, organic light-emitting diodes (OLEDs) may employ a combination of differently colored emitters, or an unpatterned broad-band emitter to emit white light together with patterned color filters, for example red, green, and blue, to create a full-color display. The color filters may be located on the substrate, for a bottom-emitter, or on the cover, for a top-emitter. For example, U.S. Pat. No. 6,392,340 entitled "Color Display Apparatus having Electroluminescence Elements" issued May 21, 2002 illustrates such a device. However, such designs are relatively inefficient since approximately two-thirds of the light emitted may be absorbed by the color filters.

OLEDs rely upon thin-film layers of organic materials coated upon a substrate. OLED devices generally can have two formats known as small-molecule devices such as disclosed in U.S. Pat. No. 4,476,292 and polymer OLED devices such as disclosed in U.S. Pat. No. 5,247,190. Either type of OLED device may include, in sequence, an anode, an organic electroluminescent (EL) element, and a cathode. The organic EL element disposed between the anode and the cathode commonly includes an organic hole-transporting layer (HTL), an emissive layer (EML) and an organic electron-transporting layer (ETL). Holes and electrons recombine and emit light in the EML layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer (ETL) and the hole transport layer (HTL) and recombine in the emissive layer (EML). Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes be recombined and result in the emission of light, etc.

In yet another alternative means of providing a full-color OLED device, an OLED device may employ a single high-frequency light emitter together with color-conversion materials (also known as color-change materials) layer to provide a variety of color light output. The color-conversion materials absorb the high-frequency light and re-emit light at lower frequencies. For example, an OLED device may emit blue light suitable for a blue sub-pixel and employ a green color-conversion material layer to absorb blue light to emit green light and employ a red color-conversion material layer to absorb blue light to emit red light. The color-conversion materials may be combined with color filters to further improve the color of the emitted light and to absorb incident light and avoid exciting the color-conversion materials with ambient light, thereby improving device contrast. US20050116621 A1 entitled "Electroluminescent devices and methods of making electroluminescent devices including a color-conversion element", e.g., describes the use of color-conversion materials.

U.S. Patent Application 20040233139A1 discloses a color-conversion member which is improved in the prevention of a deterioration in color-conversion function, the prevention of reflection of external light, and color rendering properties. The color-conversion member comprises a transparent substrate, two or more types of color-conversion layers, and a color-filter layer. The color-conversion layers function to convert incident lights for respective sub-pixels to outgoing lights of colors different from the incident lights. The two or more types of color-conversion layers are arranged on said transparent substrate. The color-filter layer is provided on the transparent substrate side of any one of the color-conversion layers or between the above any one of the color conversion layers and the color conversion layers adjacent to the above any one of the color-conversion layers. US 20050057177 also describes the use of color-conversion materials in combination with color filters.

It has also been found, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices. Because light is emitted in all directions from the internal layers of the OLED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer. Light generated from the device is emitted through the top transparent electrode. This is commonly referred to as a top-emitting device. In these typical devices, the index of the ITO layer, the organic layers, and the glass is about 1.8-2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

A variety of techniques have been proposed to improve the out-coupling of light from thin-film light emitting devices. For example, diffraction gratings have been proposed to control the attributes of light emission from thin polymer films by inducing Bragg scattering of light that is guided laterally through the emissive layers; see "Modification of polymer light emission by lateral microstructure" by Safonov et al., Synthetic Metals 116, 2001, pp. 145-148, and "Bragg scattering from periodically microstructured light emitting diodes" by Lupton et al., Applied Physics Letters, Vol. 77, No. 21, Nov. 20, 2000, pp. 3340-3342. Brightness enhancement films having diffractive properties and surface and volume diffusers are described in WO0237568 A1 entitled "Brightness and Contrast Enhancement of Direct View Emissive Displays" by Chou et al., published May 10, 2002. The use of micro-cavity techniques is also known; for example, see "Sharply directed emission in organic electroluminescent diodes with an optical-microcavity structure" by Tsutsui et al., Applied Physics Letters 65, No. 15, Oct. 10, 1994, pp. 1868-1870. However, none of these approaches cause all, or nearly all, of the light produced to be emitted from the device. Moreover, such diffractive techniques cause a significant frequency dependence on the angle of emission so that the color of the light emitted from the device changes with the viewer's perspective. Co-pending, commonly assigned U.S. Ser. No. 11/095,166, filed Mar. 31, 2005, describes the use of a microcavity OLED device together with a color filter having scattering properties and intended to reduce the angular dependence and color purity of the OLED.

Scattering techniques are also known. Chou (International Publication Number WO 02/37580 A1) and Liu et al. (U.S. Patent Application Publication No. 2001/0026124 A1) taught the use of a volume or surface scattering layer to improve light extraction. The scattering layer is applied next to the organic layers or on the outside surface of the glass substrate and has optical index that matches these layers. Light emitted from the OLED device at higher than critical angle that would have otherwise been trapped can penetrate into the scattering layer and be scattered out of the device. The efficiency of the OLED device is thereby improved but still has deficiencies as explained below.

U.S. Pat. No. 6,787,796 entitled "Organic electroluminescent display device and method of manufacturing the same" by Do et al issued 20040907 describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. U.S. Patent Application Publication No. 2004/0217702 entitled "Light extracting designs for organic light emitting diodes" by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent the encapsulating cover is disclosed. US20050142379 A1 entitled "Electroluminescence device, planar light source and display using the same" describes an organic electroluminescence device including an organic layer comprising an emissive layer; a pair of electrodes comprising an anode and a cathode, and sandwiching the organic layer, wherein at least one of the electrodes is transparent; a transparent layer provided adjacent to a light extracting surface of the transparent electrode; and a region substantially disturbing reflection and retraction angle of light provided adjacent to a light extracting surface of the transparent layer or in an interior of the transparent layer, wherein the transparent layer has a refractive index substantially equal to or more than the refractive index of the emissive layer.

Light-scattering layers used externally to an OLED device are described in U.S. Patent Application Publication No. 2005/0018431 entitled "Organic electroluminescent devices having improved light extraction" by Shiang and U.S. Pat. No. 5,955,837 entitled "System with an active layer of a medium having light-scattering properties for flat-panel display devices" by Horikx, et al. These disclosures describe and define properties of scattering layers located on a substrate in detail. Likewise, U.S. Pat. No. 6,777,871 entitled "Organic ElectroLuminescent Devices with Enhanced Light Extraction" by Duggal et al., describes the use of an output coupler comprising a composite layer having specific refractive indices and scattering properties. While useful for extracting light, this approach will only extract light that propagates in the substrate and will not extract light that propagates through the organic layers and electrodes.

It is also known to employ scattering materials within color filters to combine the functions into a single layer. For example, U.S. Pat. No. 6,731,359 describes color filters that include light scattering fine particles and has a haze of 10 to 90. The inclusion of the light-scattering fine particles within the color filter can impart a light scattering function to the color filter per se. This can eliminate the need to provide a front scattering plate on the color filter (in its viewer side). Further, a deterioration in color properties caused by light scattering can be surely compensated for by the color property correction of the colored layer per se and/or by the correction of color properties through the addition of a colorant. This is suitable for surely preventing deterioration in color properties of the color filter per se.

However, scattering techniques, by themselves, cause light to pass through the light-absorbing material layers multiple times where they are absorbed and converted to heat. Moreover, trapped light may propagate a considerable distance horizontally through the cover, substrate, or organic layers before being scattered out of the device, thereby reducing the sharpness of the device in pixellated applications such as displays. A light ray emitted from the light-emitting layer may be scattered multiple times, while traveling through the substrate, organic layer(s), and transparent electrode before it is emitted from the device. When the light ray is finally emitted from the device, the light ray has traveled a considerable distance through the various device layers from the original sub-pixel location where it originated to a remote sub-pixel where it is emitted, thus reducing sharpness. Most of the lateral travel occurs in the substrate, because that is by far the thickest layer in the package. Also, the amount of light emitted is reduced due to absorption of light in the various layers.

U.S. Patent Application Publication No. 2004/0061136 entitled "Organic light emitting device having enhanced light extraction efficiency" by Tyan et al., describes an enhanced light extraction OLED device that includes a light scattering layer. In certain embodiments, a low index isolation layer (having an optical index substantially lower than that of the organic electroluminescent element) is employed adjacent to a reflective layer in combination with the light scattering layer to prevent low angle light from striking the reflective layer, and thereby minimize absorption losses due to multiple reflections from the reflective layer. The particular arrangements, however, may still result in reduced sharpness of the device.

Co-pending, commonly assigned U.S. Ser. No. 11/065, 082, filed Feb. 24, 2005, describes the use of a transparent low-index layer having a refractive index lower than the refractive index of the encapsulating cover or substrate through which light is emitted and lower than the organic layers to enhance the sharpness of an OLED device having a scattering element. US 20050194896 describes a nano-structure layer for extracting radiated light from a light-emitting device together with a gap having a refractive index lower than an average refractive index of the emissive layer and nano-structure layer. In various described embodiments, such nano-structure layer may be used in combination with color conversion material or color filter layers. Such disclosed designs still, however, do not completely optimize the use of emitted light, particularly for displays with four-color pixels including a white emitter.

For any practical OLED device, it is important to minimize the cost and maximize the yield of manufacturing the device. Applicants have determined through experience and experiment, that the integration of the various components can be complex and the various layers may have process incompatibilities. There is a need therefore for improved organic light-emitting diode devices, and processes for forming such devices that provide reduced cost and improved yields.

SUMMARY OF THE INVENTION

In accordance with one embodiment, the invention is directed towards a top-emitting organic light-emitting diode (OLED) device, comprising:

one or more OLEDs formed on a substrate, the OLED including a first electrode formed over the substrate, one or more layers of light-emitting organic material formed over the first electrode, and a transparent second electrode formed over the one or more layers of light-emitting organic material;

a light-scattering layer formed over the one or more OLEDs for scattering light emitted by the one or more layers of light-emitting organic material;

a transparent cover;

one or more color filters formed on the transparent cover; and a color-conversion material layer formed over the color filters, or formed over or integral with the light-scattering layer;

wherein the substrate is aligned and affixed to the transparent cover so that the locations of the color filters and color conversion material correspond to the location of the OLEDs, and the color-conversion material layer, color filters, and the light-scattering layer are between the cover and substrate, and a low-index gap is formed between the light-scattering layer and the color filters, with no light-scattering layer being positioned between the color conversion material layer and the low-index gap.

ADVANTAGES

The present invention has the advantage that it improves the performance and reduces the cost of an OLED device.

It will be understood that the figures are not to scale since the individual layers are too thin and the thickness differences of various layers too great to permit depiction to scale.

DETAILED DESCRIPTION OF THE INVENTION

Figure 1:
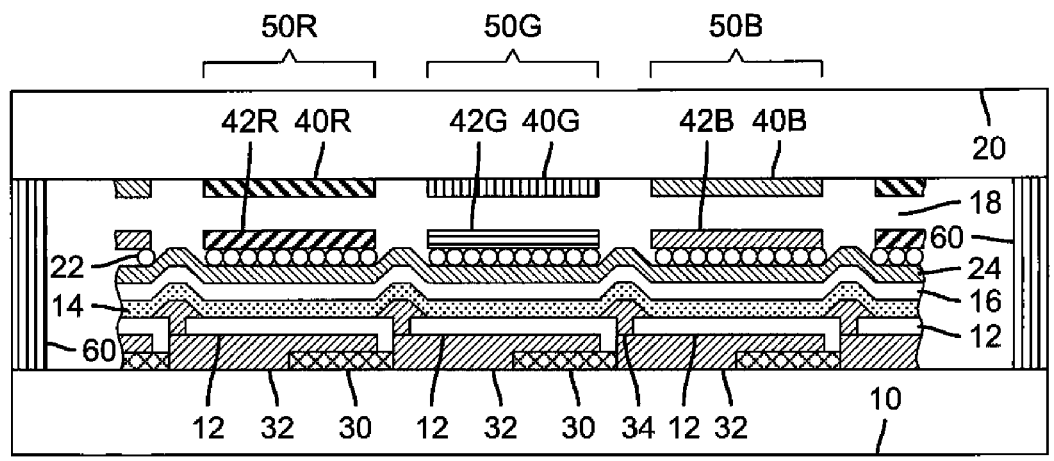
FIG. 1 illustrates a cross section of an active-matrix top-emitter OLED device having a color filter and color-conversion materials made according to an embodiment of the present invention.
Figure 2:
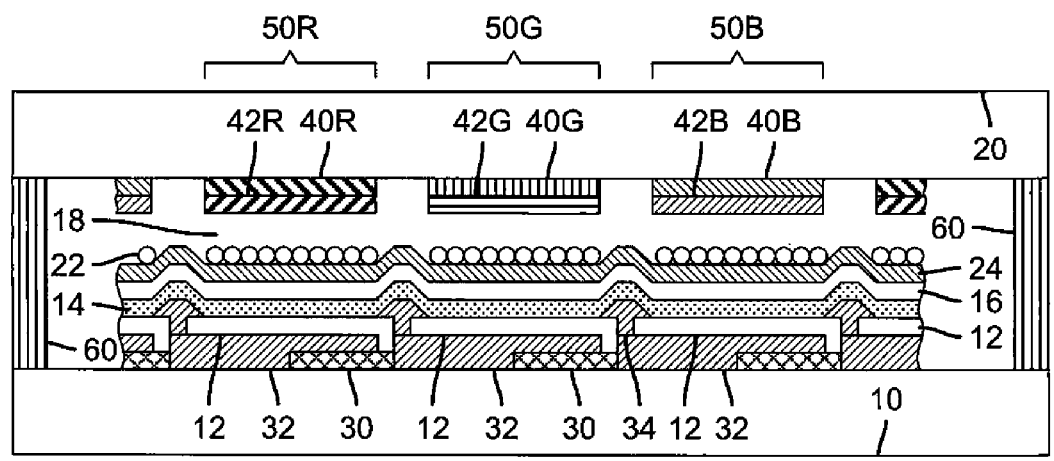
FIG. 2 illustrates a cross section of an active-matrix top-emitter OLED device having a color filter and color-conversion materials made according to an alternative embodiment of the present invention.

Referring to FIGS. 1 and 2, according to various embodiments of the present invention, a top-emitting OLED device comprises one or more OLEDs formed on a substrate 10, the OLED including a first electrode 12 formed over the substrate 10, one or more layers 14 of light-emitting organic material formed over the first electrode 12, and a transparent second electrode 16 formed over the one or more layers 14 of light-emitting organic material; a light-scattering layer 22 formed over the one or more OLEDs for scattering light emitted by the one or more layers 14 of light-emitting organic material; a transparent cover 20; one or more color filters 40 formed on the transparent cover 20; a color-conversion material layer 42 formed over the color filters 40 (FIG. 2) or the light-scattering layer 22 (FIG. 1); wherein the substrate 10 is aligned and affixed to the transparent cover 20 so that the locations of the color filters 40 and color conversion material 42 correspond to the location of the OLEDs, and the color-conversion material layer 42, color filters 40, and the light-scattering layer 22 are between the cover 20 and substrate 10, and a low-index gap 18 is formed between the light-scattering layer 22 and the color filters 40, with no light-scattering layer being positioned between the color conversion material layer 42 and the low-index gap 18. As used herein, a low-index gap defines a gap between layers formed on the substrate and layers formed on the cover, wherein the gap has an optical refractive index lower than that of the cover and all layers between the scattering layer and the cover.

The present invention may be employed in either a passive- or active-matrix configuration. In the active-matrix configuration of FIGS. 1 and 2, thin-film electronic components 30 are formed on the substrate and electrically connected to patterned electrodes 12 to form light-emitting elements corresponding to light-emitting areas 50. A planarization layer 32 protects the thin-film electronic components 30. A second planarization layer 34 separates the patterned electrodes 12.

As illustrated in FIGS. 1 and 2, the color filters 40 may comprise red 40R, green 40G, and blue 40B color filters patterned in a common layer. Likewise, the color conversion material layer 42 may comprise red 42R, green 42G, and blue 42B color-conversion materials patterned in a common layer. According to various alternative embodiments of the present invention, the blue color conversion material 42B may be absent.

As shown in the embodiment of FIG. 1, the color conversion material layer 42 is located on the light-scattering layer 22 adjacent to the low-index gap 18 and opposite the color filters 40. As shown in the embodiment of FIG. 2, the color conversion material layer 42 is located on the color filters 40 adjacent to the low-index gap 18 and opposite the light-scattering layer 22. In various alternative embodiments, a non-scattering protective layer (not shown) transparent to the frequencies of light emitted by the color-conversion materials 42 (FIG. 1) or to the frequencies of light emitted by light-emitting layer(s) 14 (FIG. 2) may be formed over the color-conversion materials 42.

According to the present invention, a color-conversion layer 42 corresponding to a color filter 40 means that the color-conversion layer 42 converts incident light from the light-emissive layer 14 to a lower-frequency light whose frequency range overlaps the frequency range of the light passed by the color filter 40. For example, a color-conversion layer 42R that converts incident light to a substantially red color corresponds in location to a substantially red color filter 40. Likewise, a color-conversion layer 42G may convert incident light to a substantially green color corresponding in location to a substantially green color filter 40G and a color-conversion layer 42B that converts incident light to a substantially blue color corresponds in location to a substantially blue color filter 40B. If the light-emitting organic layer 14 emits blue light or a broadband white light including blue light, the color-conversion layer 42B may be omitted.

As used herein, a color filter is a layer of light-absorptive material that strongly absorbs light of one frequency range but largely transmits light of a different frequency range. For example, a red color filter will mostly absorb green- and blue-colored light while mostly transmitting red-colored light. Such color filter materials typically comprise pigments and dyes but, as used herein, explicitly exclude color conversion materials such as fluorescent and phosphorescent materials. In various embodiments of the present invention, the color filter 40 may be employed as trimming filters to further control the emitted color and to absorb a portion of ambient light. This absorption of ambient light will also have the beneficial effect of reducing any stimulation of the color-conversion layer 42 by ambient light, thereby improving contrast. As used herein, a color-conversion material (CCM), also known as a color-change material, or color-conversion or color-change layer, is a layer of material that absorbs light of one frequency range and re-emits light at a second, lower frequency range. Such materials are typically fluorescent or phosphorescent. Both materials are known in the prior art. Color-conversion materials are occasionally referred to as color filters in the art, however, as indicated above in the present invention the term color filters is employed to refer to materials that only absorb light and do not themselves emit light.

The light-scattering layer 22 is formed over the transparent electrode 16. As further illustrated in FIGS. 1 and 2, a protective layer 24 may be formed over the transparent electrode 16 to protect it from environmental contaminants due to manufacturing processes (such as the deposition of the scattering layer 22) or to use. The cover 20 and substrate 10 are affixed in alignment using, for example, an encapsulating adhesive 60, so that the light-emitting areas 50R, 50G, 50B of the OLED are aligned with the corresponding color-conversion layer 42 and color filters 40 to optimize the emission of light from the light-emissive organic material layer 14 into the color-conversion layer 42 and thence through the color filter 40 and the cover 20. A low-index element 18 is provided between the scattering layer 22 and the color filters 40. The use of a scattering layer 22 in combination with a low-index element 18 is described in co-pending, commonly assigned U.S. Ser. No. 11/065,082, filed Feb. 24, 2005, the disclosure of which is incorporated by reference herein, and is also discussed in further detail below.

Figure 3:
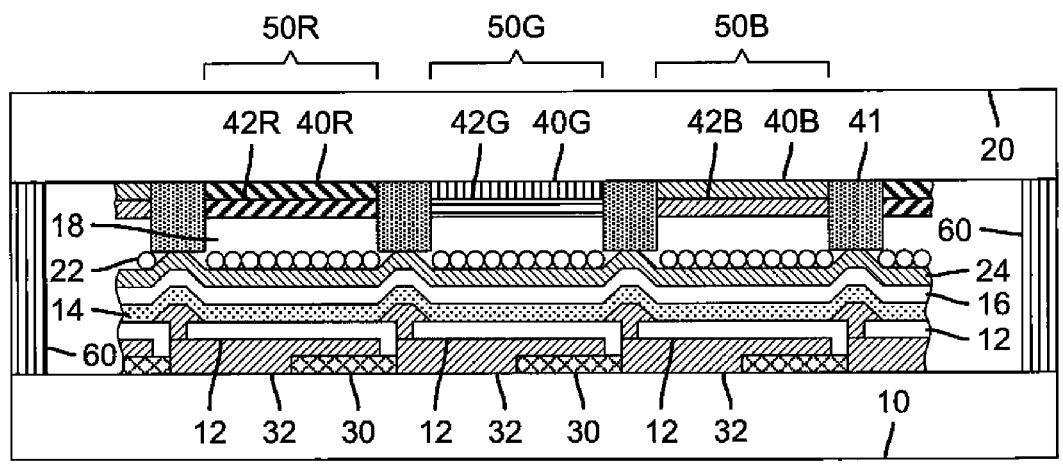
FIG. 3 illustrates a cross section of an active-matrix top-emitter OLED device having a color filter, color-conversion materials, and a black matrix between the color filters according to another embodiment of the present invention.

Referring to FIG. 3, in a preferred embodiment, a black matrix 41 is formed on the cover 20 to absorb incident ambient light that would otherwise be reflected from non-emissive areas between the OLEDs and defined by the patterned electrode 12, thereby improving the ambient contrast of the OLED device. The black matrix 41 may be first formed using photolithographic processes to provide wells into which the color-filter materials 40 and/or color-conversion layers 42 may be secondly deposited, for example by inkjet deposition or solution processes. Alternatively, the black matrix 41, color filters 40, and color-conversion layers 42 may all be formed photolithographically.

Figure 4:
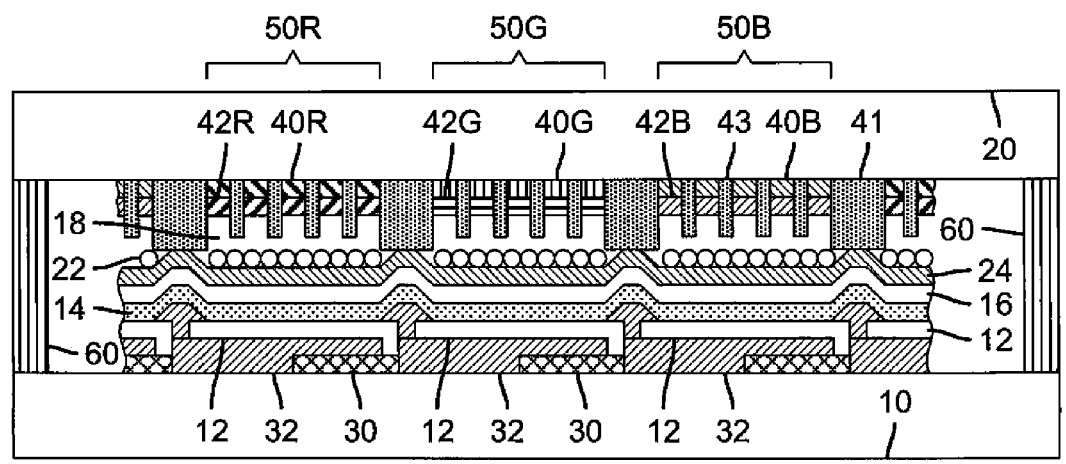
FIG. 4 illustrates a cross section of an active-matrix top-emitter OLED device having a color filter, color-conversion materials, and a black matrix within the light-emissive area according to another embodiment of the present invention.

If, as is shown in FIG. 3, the black-matrix 41 is formed to be thicker than the combination of the color filters 40 and the color-conversion layer 42, it may serve as a standoff or spacer to separate the color-conversion layer 42 from the scattering layer 22, and form the low-index gap 18. Alternatively, the color-conversion layer 42 may be formed over the scattering layer 22 and the black matrix 41 may be in contact with the color conversion layer 42 between the light-emissive areas. It is also possible for the color-conversion materials 42 to be patterned in the light-emissive areas only so that the black matrix is in contact with the scattering layer 22 or the transparent electrode 16. In other embodiments of the present invention, other means may be employed to separate the color-conversion layer 42 from the scattering layer 22, for example as disclosed in co-pending, commonly assigned U.S. Ser. No. 11/158,595 filed Jun. 22, 2005, U.S. Ser. No. 11/179, 409 filed Jul. 12, 2005, and U.S. Ser. No. 11/179,186 filed Jul. 12, 2005, the disclosures of which are incorporated by reference herein. Referring to FIG. 4, in a further embodiment of the present invention, a plurality of black-matrix light-absorbing structures 43 are formed within the light-emissive areas defined by the patterned electrode 12. These structures are preferably relatively thin (in at least one horizontal dimension parallel to the substrate 10 or cover 20) and tall (in the vertical dimension orthogonal to the substrate 10 or cover 20). Such structures will serve to absorb any ambient light incident at a high angle on the OLED device, thereby reducing the reflection of the ambient light and improving the ambient contrast of the OLED device. Although some light emitted at a high angle will also be absorbed, thereby reducing the brightness of the OLED when viewed at large angles to the normal, light emitted orthogonally to the substrate will not be absorbed. Furthermore, incident light may be re-scattered by the scattering layer 22 and advantageously further absorbed by such elements 43 to provide improved ambient contrast, as is taught in co-pending, commonly-assigned U.S. Ser. No. 11/297,196 filed Dec. 8, 2005, the disclosure of which is incorporated by reference herein.

Figure 5:
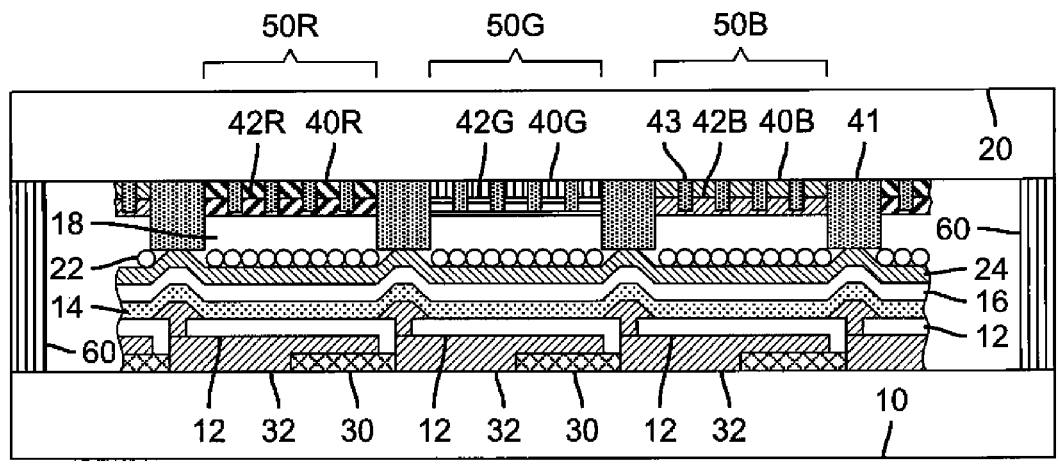
FIG. 5 illustrates a cross section of an active-matrix top-emitter OLED device having thicker color filters and color-conversion materials, and a black matrix within the light-emissive area according to another embodiment of the present invention.

As is shown in FIG. 4, the black-matrix materials 41, 43 may be thicker than the color filters 40 and color-conversion layers 42 combined. Since the black-matrix structures 43 may be near each other and capillary action a significant factor in the deposition of color filter 40 and color-conversion materials 42, the color filter 40 and color-conversion materials 42 may extend beyond the structures 43 as shown in FIG. 5. Since, within each light-emissive area 50, the same color of filter and conversion materials are employed, the presence of the filter and conversion materials beyond the structure 43 do not have an effect on the color or emission of light.

Figure 6A:
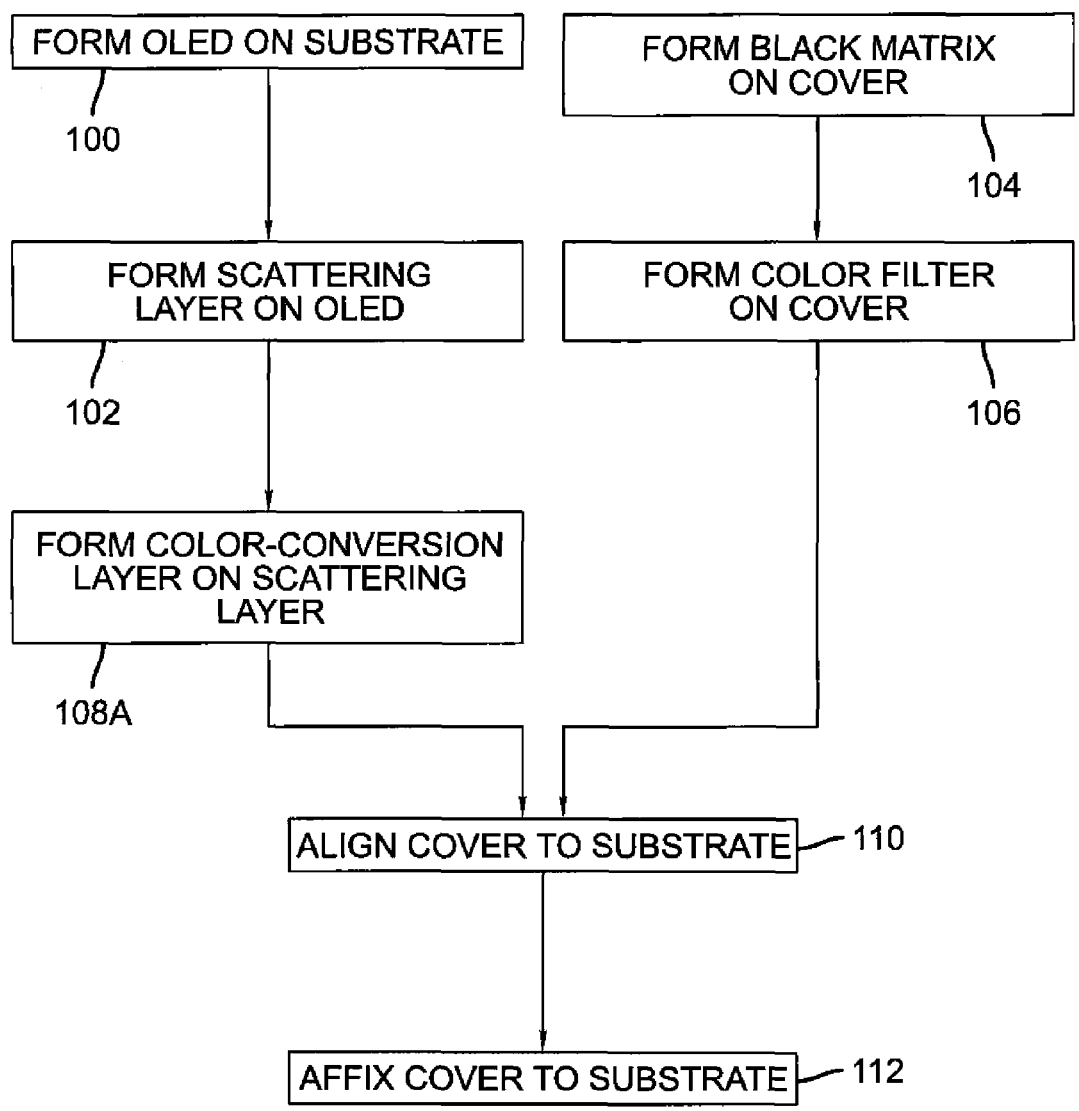
FIG. 6A is a flow diagram according to a method of the present invention.
Figure 6B:
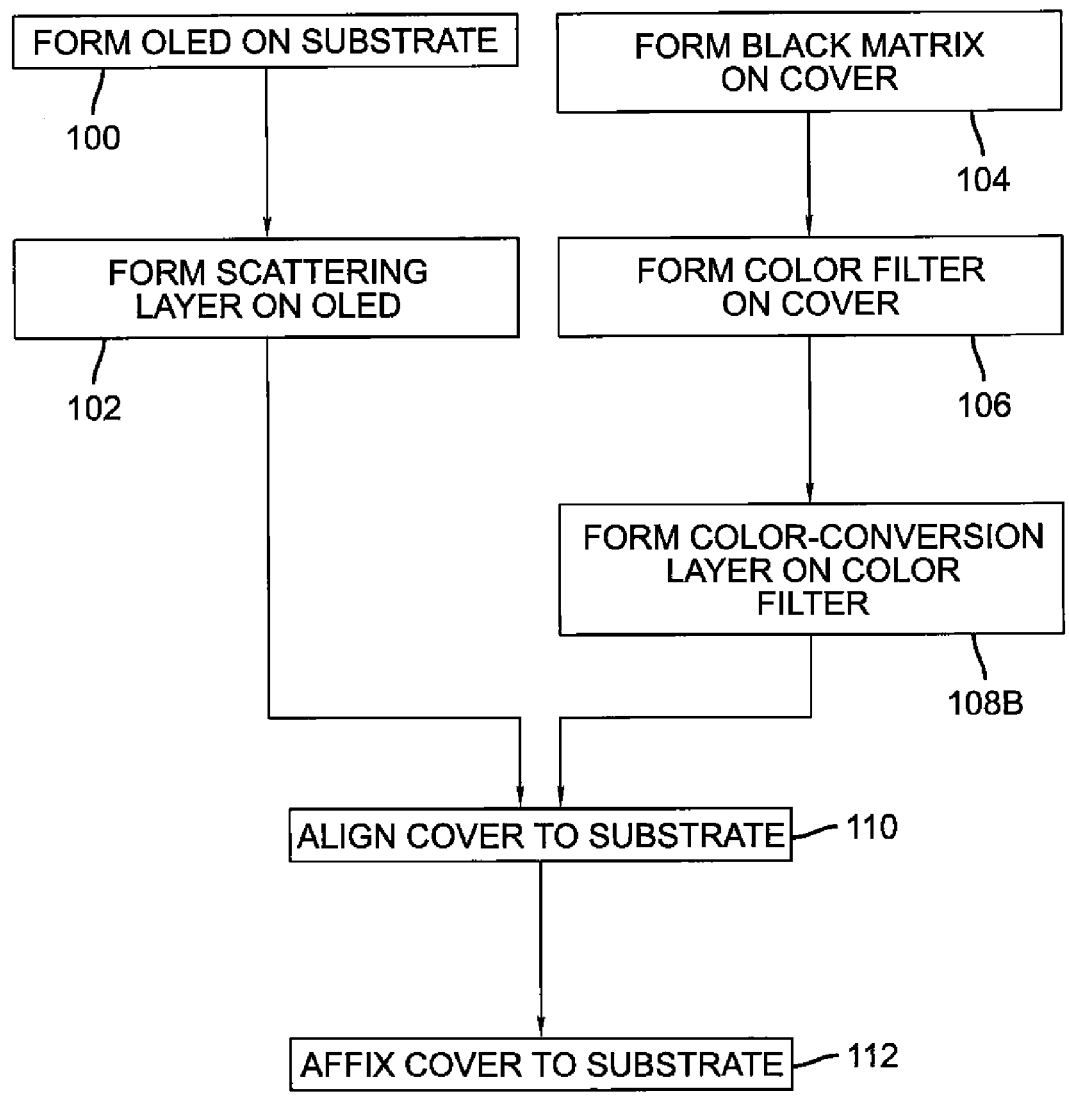
FIG. 6B is a flow diagram according to an alternative method of the present invention.

Referring to FIGS. 6A and 6B, a method of making a top-emitting OLED device according to the present invention comprises the steps of forming 100 one or more OLEDs on a substrate, the OLED including a first electrode formed over the substrate, one or more layers of light-emitting organic material formed over the first electrode, and a transparent second electrode formed over the one or more layers of light-emitting organic material; forming 102 a light-scattering layer over the one or more OLEDs for scattering light emitted by the one or more layers of light-emitting organic material; forming 106 one or more color filters on a transparent cover; forming 108A a color-conversion layer over the light-scattering layer (FIG. 6A) or forming 108B a color-conversion layer over the color filter (FIG. 6B); aligning 110 the substrate to the cover so that the location of the color filters corresponds to the location of the OLEDs, and the color-conversion material layer, color filters, and the scattering layer are between the cover and substrate; affixing 112 the transparent cover to the aligned substrate so that a low-index gap is formed between the light-scattering layer and the color filters, with no light-scattering layer being positioned between the color conversion material layer and the low-index gap. In a preferred embodiment of the present invention, a black matrix comprising light-absorbing material may also be formed 104 on the cover.

The present invention is preferred to the prior art by employing two separate manufacturing processes, one for the substrate 10 and the layers formed thereon and the second for the cover 20 and the layers formed thereon. Conventional OLED manufacturing processes have relatively low yields for the TFT components 30 and organic layers 14. If the color filters 40, black matrix 41, 43, and color-conversion layer 42 were subsequently formed over the OLED layers, the yields would be reduced. If, according to the present invention, the color filters 40, black matrix 41 and 43, and color-conversion layers 42 are formed on a separate cover 20, they can be separately qualified and combined with similarly qualified substrates 10, thereby improving the overall yield.

Moreover, it is difficult to pattern elements such as black-matrix materials 41, color-conversion layer 42 and color filters 40 over the organic layers 14. Photolithographic processes, including chemicals and ultra-violet light, can be quite damaging to the organic materials and extra, protective layers 24 may be necessary to prevent such damage. Even deposition processes such as inkjet typically include solvents that may damage the OLED materials. The low-index gap 18 would also be difficult to form if layers such as color-conversion layers 42 or color filters 40 where subsequently depositing over the OLED layers. Hence, the formation of the black-matrix 41, color filters 40, and color-conversion layers 42 on the cover 20 followed by alignment and affixing to the substrate 10 will improve yields and reduce manufacturing costs.

In operation, when stimulated by a current controlled by the thin-film electronic components 30, the light-emitting layer 14 may emit a broadband white light, an ultra-violet light, a blue light, or a broadband light including blue light or ultra-violet light. Due to internal reflections, at least some portion of this light is trapped in the organic layers 14 and transparent electrode 16. The scattering layer 22 scatters out the trapped light and other light into the color-conversion layers 42. The color conversion layer 42R converts the incident light into red light for red light-emitting element 50R, color conversion layer 42G converts the incident light into green light for green light-emitting element 50G, and color conversion layer 42B, if present, converts the incident blue or ultra-violet light into blue light for blue light-emitting element 50B. The color-conversion materials 42 emit light in every direction. In the configuration of FIG. 1, some of the light may be emitted toward the scattering layer 22 or trapped in the color conversion layer 42. The scattering layer 22 will then scatter the converted light into an angle that allows the light to escape into the low-index layer 18 and thence from the OLED device. Scattering layer 22 preferably is a multi-frequency (or pan-chromatic) scattering layer capable of scattering light of a variety of frequencies, including broadband light (or white light) and a variety of colored lights, for example blue, green, and red. Hence, the scattering layer 22 preferably can scatter both the emitted light and the converted light, of whatever frequencies, so that only a single scattering layer is necessary in the device. A single scattering layer reduces the number of reflections and the average path length of the light, thereby reducing absorption and improving the light output. Moreover, the use of a single, multi-frequency scattering layer 22 to scatter light of at least two different frequency ranges, or colors, reduces costs and improves yields. Applicants have constructed a suitable scattering layer optically integrated with an OLED device.

According to the embodiment of FIG. 2, converted light may be trapped in the cover because there is no scattering layer in direct optical contact with the color-conversion layer 42. However, any light emitted into the low-index gap 18 may be reflected or scattered back and will pass through the color-conversion material 42, the color filters 40, and the cover 20, since they all have a higher optical index than the low-index gap 18. The embodiment of FIG. 2 may have reduced manufacturing costs, since the process for coating a color-conversion material layer 42 is likely to be lower cost and have higher yields than coating an equivalent layer on an OLED structure. Moreover, the cost of a damaged cover 20 with color filters 40 is much lower than the cost of a damaged substrate 10 with TFT and OLED structures deposited thereon. Hence, the embodiment of FIG. 2 may have reduced costs as well as improved yields.

According to a preferred embodiment of the present invention, the color-conversion layer has a refractive index lower than the refractive index of the color filter layer and the refractive index of the cover. Hence, in the embodiment of FIG. 2, light would not be trapped in the color-conversion layer 42.

The light-emitting elements of the present invention may be independently controlled and grouped into full-color pixels and a plurality of such pixels provided to form a display device. Each color of the color filters may be formed in a common manufacturing step, as may each color of the color-conversion layers. According to a further embodiment of the present invention, the display device may have two independently controllable light-emitting elements that employ color filters and color conversion layers and emit red and green light respectively and a third independently controllable light-emitting element that emits blue light and optionally includes a color filter and color conversion layer.

As illustrated in FIGS. 1 and 2, a scattering layer 22 optically coupled to the light-emitting layer 14 increases the light emitted from the OLED device. The scattering layer 22 extracts trapped light from within the OLED organic and electrode layers. A low-index gap 18 serves to optically isolate the cover 20, color filters 40 and color-conversion layers 42 and thereby maintain the sharpness of a pixilated display device.

Light incident at any angle on the scattering layer 22 may be scattered into an angle that allows the light to enter the low-index gap 18. Because the low-index gap 18 has a lower optical index than the cover 20, light that passes into the low-index gap 18 cannot be trapped in the cover 20 and thus escapes from the OLED device. Emitted or re-emitted light that does not enter into the low-index gap 18 will re-enter the scattering layer 22 and be re-scattered until it eventually escapes. Light re-scattered toward the substrate can be reflected back and scattered again. The low-index gap 18 has an optical index lower than that of the color filters 40 and color conversion layer 42 so that if light passes from the low-index gap into the color filters 40 and color conversion layer 42, it will escape from the device. Light that is emitted by the color-conversion layer 42 is likewise emitted in all directions. Some light may be emitted back toward the OLED and reflected, re-scattered, and emitted from the OLED device. In a preferred embodiment as shown in FIG. 2, the refractive index of the color-conversion layer 42 is close to or less than the refractive index of the color filters 40 and the cover 20 to avoid scattered light trapping in the cover 20 or color filters 40. In an alternative embodiment of the present invention, the color-conversion layer 42 is formed on the scattering layer 22 as shown in FIG. 1 and its index may not have such preferences.

In various embodiments of the present invention, an OLED device may comprise a plurality of independently-controllable light-emitting elements forming a full-color display device. For example, the independently controllable light-emitting elements may be grouped into full-color pixels, each having at least a red, green, and blue light emitter. The one or more layers 14 of light-emitting organic material may emit broadband light that contains at least two colors of light, the color-conversion material layer 42 may comprise material that converts relatively higher frequency components of the broadband light to lower frequency light, and the color filters 40 may be correspondingly patterned with the color-conversion material layer 42 to form sub-pixel elements emitting different colors of light. In a particular embodiment, the one or more layers 14 of light-emitting organic material emit broadband light that contains blue and at least one other color of light, a color-conversion material that converts relatively higher frequency components of the broadband light to green light is correspondingly patterned with at least one of the OLEDs to form a green sub-pixel, a color-conversion material that converts relatively higher frequency components of the broadband light to red light is correspondingly patterned with at least one other of the OLEDs to form a red sub-pixel, and a blue color filter directly filtering emitted broadband light is correspondingly patterned with at least one additional other of the OLEDs to form a blue sub-pixel. Furthermore, the green color filters may be correspondingly patterned with the green sub-pixels and/or red color filters correspondingly patterned with the red sub-pixels. In a specific embodiment of the present invention, the broadband light may be substantially white. Moreover, each pixel may further comprise a white sub-pixel that may not need any filters. This white sub-pixel may be used in combination with red, green, and blue sub-pixels to form an RGBW pixel having higher efficiency than a conventional OLED device having a white OLED emitter in combination with red, green, and blue color filters alone.

Accordingly, in one embodiment, OLED devices of the invention may comprise substantially white light emitting OLED organic layers, with color filters correspondingly patterned with a color-conversion material layer to form sub-pixel elements each emitting one of substantially red, green or blue light or one of substantially red, green, blue or white light. Alternatively, it may be preferable to employ OLED organic layers that emit broadband light that is not white, and further employ color-conversion materials selected to convert a portion of the broadband light to form substantially white light and patterned to form white sub-pixels.

Black-matrix materials may be formed from carbon black in a polymeric binder. Black-matrix materials are well-known and may, for example, comprise a polymer or resin with carbon black. Chrome oxide is also known.

In preferred embodiments, the cover 20 and substrate 10 may comprise glass or plastic with typical refractive indices of between 1.4 and 1.6. The transparent low-index gap 18 may comprise a void, or may be filled with a solid, liquid, or gaseous layer of optically transparent material. For example air, nitrogen, helium, or argon all have a refractive index of between 1.0 and 1.1 and may be employed. Lower index solids which may be employed include fluorocarbon or MgF, each having indices less than 1.4. Any gas employed is preferably inert. Reflective electrode 12 is preferably made of metal (for example aluminum, silver, or magnesium) or metal alloys. Transparent electrode 16 is preferably made of transparent conductive materials, for example indium tin oxide (ITO) or other metal oxides. The organic material layer(s) 14 may comprise organic materials known in the art, for example, hole-injection, hole-transport, light-emitting, electron-injection, and/or electron-transport layers. Such organic material layers are well known in the OLED art. The organic material layer(s) 14 typically have a refractive index of between 1.6 and 1.9, while indium tin oxide has a refractive index of approximately 1.8-2.1. Hence, the various organic and transparent electrode layers in the OLED have a refractive index range of 1.6 to 2.1. Of course, the refractive indices of various materials may be dependent on the wavelength of light passing through them, so the refractive index values cited here for these materials are only approximate. In any case, the transparent low-index element 18 preferably has a refractive index at least 0.1 lower than that of each of the first refractive index range and the second refractive index at the desired wavelength for the OLED emitter.

Scattering layer 22 may comprise a volume scattering layer or a surface scattering layer. In certain embodiments, e.g., scattering layer 22 may comprise materials having at least two different refractive indices. The scattering layer 22 may comprise, e.g., a matrix of lower refractive index and scattering elements have a higher refractive index. Alternatively, the matrix may have a higher refractive index and the scattering elements may have a lower refractive index. For example, the matrix may comprise silicon dioxide or cross-linked resin having indices of approximately 1.5, or silicon nitride with a much higher index of refraction. If scattering layer 22 has a thickness greater than one-tenth part of the wavelength of the emitted light, then it is desirable for the index of refraction of at least one material in the scattering layer 22 to be approximately equal to or greater than the first refractive index range. This is to insure that all of the light trapped in the organic layers 14 and transparent electrode 16 can experience the direction altering effects of scattering layer 22. If scattering layer 22 has a thickness less than one-tenth part of the wavelength of the emitted light, then the materials in the scattering layer need not have such a preference for their refractive indices.

In an alternative embodiment, scattering layer 22 may comprise particles deposited on another layer, e.g., particles of titanium dioxide may be coated over transparent electrode 16 to scatter light. Preferably, such particles are at least 100 nm in diameter and may be in the range of 1 to 2 microns in diameter to optimize the scattering of multiple frequency ranges of visible light. In a particular embodiment where color filters 40 and color conversion layer 42 are formed on the cover 20, scattering layer 22 may comprise a scattering layer having a rough surface comprising a plurality of relatively high-refractive index light-scattering transparent particles projecting into the low-index gap 18 without contacting the cover and further comprising an adhesive binder in contact with at least some of the light-scattering particles to adhere the light-scattering particles to the OLED. Such a rough surfaced scattering layer is described in further detail in U.S. Ser. No. 11/361,488 filed Feb. 24, 2006 by Ronald S. Cok et al., the disclosure of which is incorporated herein by reference. In a further alternative, scattering layer 22 may comprise a rough, diffusely reflecting or refracting surface of electrode 16 itself.

Figure 7:
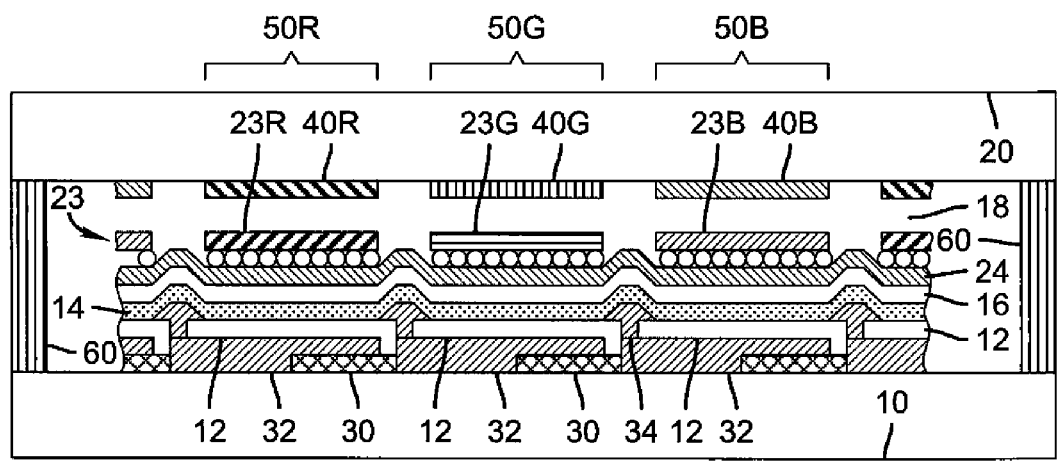
FIG. 7 illustrates a cross section of an active-matrix top-emitter OLED device having scattering and color-conversion materials in a common layer according to an alternative embodiment of the present invention.

In yet another embodiment of the present invention, referring to FIG. 7, the color-conversion material layer may be formed integral with the scattering layer in a common layer 23. Integral light-scattering color-conversion layers are also described in U.S. Ser. No. 11/361,094 filed Feb. 24, 2006 by Ronald S. Cok et al., the disclosure of which is incorporated herein by reference. Such an integral light-scattering and color-conversion material layer 23 may be advantageously employed to extract light from the organic light-emitting layer(s) 14 and to convert the extracted light to light having a preferred spectrum. Such a combined, integral layer may have advantages in deposition or performance, for example the scattering materials, e.g. particles, may be mixed with the color-conversion materials in a common solvent and/or matrix and deposited in a single step. Since the color-conversion materials may include dyes comprising relatively small molecules within the matrix, the color-conversion materials may not interfere with the light extraction. Alternatively, if small, light-converting particles are employed, the particles are typically smaller (e.g. less than 10 nm in diameter) than the multi-frequency light-scattering particles preferred for the current invention and do not interfere with light extraction. If some scattering due to the particles does take place, the additional scattering is not likely to inhibit the light extraction and may, in fact, aid it. Moreover, the integration of the color-changing materials in the scattering layer may enhance the light conversion by increasing the likelihood that an incident photon will encounter a color conversion material element. Furthermore, the scattering particles in the integral layer will serve to scatter converted light that may waveguide in the color-conversion material. Both light-converting dyes and particles are known in the art.

Figure 8A:
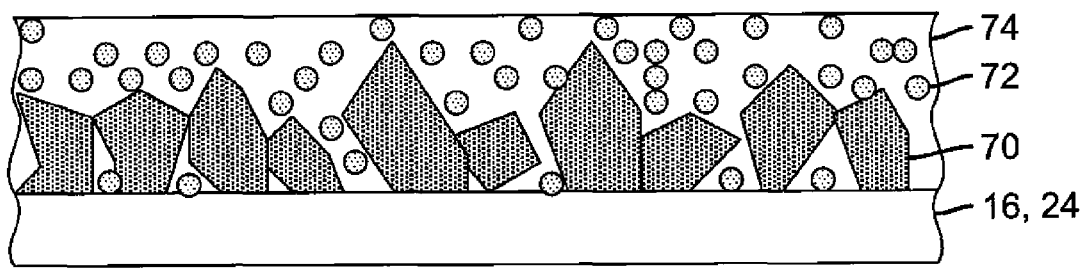
FIGS. 8A-8C illustrate cross sections of various embodiments of integral light-scattering and color-conversion material layers having a thick matrix, a thin matrix, and no matrix, respectively according to alternative embodiments of the present invention.

Referring to FIG. 8A, such an integral light-scattering layer 23 is illustrated having light-scattering particles 70 coated on an electrode 16 or electrode protective layer 24 to enable extraction of light trapped within the OLED. These light-scattering particles 70 are in contact with or immediately adjacent (less than one wavelength of light distant) to electrode 16 or electrode protective layer 24. A transparent matrix material 74 surrounds and covers the light-scattering particles 70 and further includes color-conversion materials 72, either fluorescent or phosphorescent dye molecules or other color-conversion particles such as quantum dots. The color-conversion materials 72 are distributed throughout the transparent matrix 74 and between and intermixed with the light-scattering particles 70. The light-scattering particles 70 are typically much larger than the color-conversion materials 72. Applicants have determined that, surprisingly and contrary to theoretical calculations using Mies theory, the optimal average size of light-scattering particles may be greater than or equal to 400 nm in diameter and more preferably between one and two microns in average diameter while the color-conversion materials are preferably less than 400 nm in diameter, and may be less than 100 nm or even less than 10 mn in diameter. This may be due to the fact that important assumptions of Mies theory are not met with a randomly oriented layer of arbitrarily shaped particles that are not strictly in a mono-layer.

Light-scattering particles 70 of the present invention may serve at least three functions. A first function is to extract trapped light from the OLED device. To enable this, the light-scattering particles 70 must be in contact or very close to (less than the wavelength of light distant) to a transparent layer of the OLED (the electrode 16 or electrode protection layer 24, in this example). At the same time, a second function of the light-scattering particles 70 is to enhance the likelihood that extracted OLED light will encounter the color-conversion material 72 in as short a path length as possible to reduce light absorption. Because the color-conversion materials 74 tend to quench each other, they must be located somewhat distant from each other; by intermixing the color-conversion materials 72 in an integral layer with the light-scattering particles 70, the extracted OLED light will be reflected or refracted in many directions before it escapes from the scattering layer 23, increasing the likelihood that the extracted light will be frequency-converted and thereby reducing the thickness of the integral layer 23 and the amount of color-conversion material 72. A third function of the light-scattering particles 70 is to scatter the frequency-converted light. Because the particles may emit light within a matrix 74 having an optical index greater than that of the adjacent low-index layer (e.g. 18), frequency-converted light may be trapped within the matrix 74 in a fashion similar to the trapped OLED light. The light-scattering particles 70 (and to a lesser extent, the color-conversion materials 72) may scatter this trapped frequency-converted light so it can be emitted from the OLED device. Because the extracted OLED light is of a different frequency from the scattered, frequency-converted light, it is most helpful if the scattering particles 70 form a multi-frequency scattering layer 23 (or 22) so that the particles 70 effectively scatter light of at least two colors and, more preferably form a broadband light scattering layer. Moreover, it is important not to absorb any light of the desired frequency that is extracted from the OLED device. Hence, it is important to balance the thickness of the light-scattering particle layer and the concentration of the color-conversion materials 72 to optimize the output of light of the desired frequency.

Such an integral layer 23 may be formed by first depositing a layer of light-scattering particles 74 in a solvent and an optional binder. For example, applicants have effectively coated such a layer by employing titanium dioxide in toluene or xylene with an optional urethane binder. The optional binder is included in very small amounts to act as a surfactant and adhesive and does not serve as a matrix 74. The solution may be coated by employing any of a variety of coating methods, including spin, jet, hopper, and spray coating, as demonstrated by Applicant. The coated solvent evaporates, leaving a layer of scattering particles 70 adhered to a surface, for example an electrode protection layer 24. In a second step, a matrix 74, for example a polymer or resin containing a dispersion of color-conversion particles 72 with or without a surfactant to prevent flocculation and to aid capillary action, is coated over the layer of light-scattering particles 70 using any of the above-listed methods. Capillary action causes the matrix 74 dispersion to intermix by flowing over, into, and between the light-scattering layer and particles 70 to form an integral light-scattering and color-conversion material layer 23. Applicants have effectively demonstrated this process and the action of the light-scattering particles 70 and the color-conversion material 72.

Figure 8B:
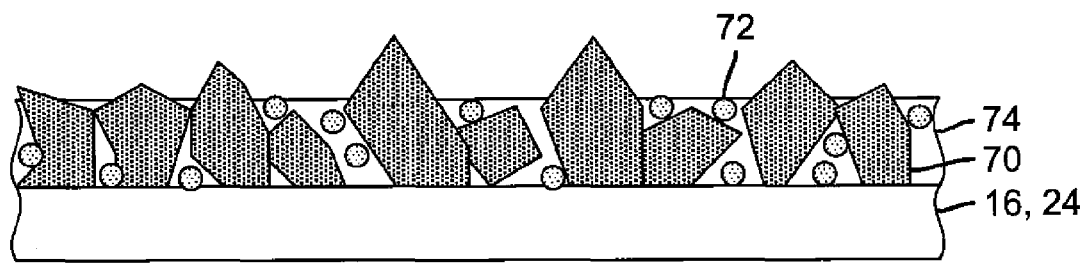
Figure 8C:
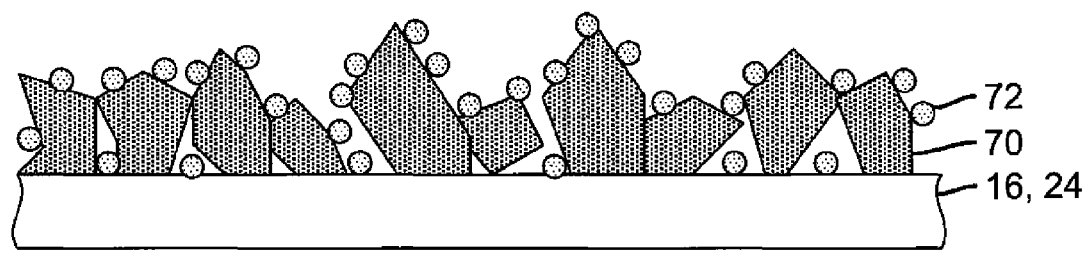

In the embodiment illustrated in FIG. 8A, the integral layer 23 is thicker than the size of the light-scattering particles 70 so that the light-scattering particles 70 are covered by the matrix 74. While this is effective and enables a relatively thick integral layer 23 with a relatively large amount of color-conversion material thereby improving the amount of color-converted light, the difference in optical refractive index between the light-scattering particles 70 and the matrix 74 will typically be less than the difference in optical index between the light-scattering particles 70 and the low-index layer 18. This difference of the optical refractive index of the two media can reduce the light extraction effectiveness of the light-scattering layer for the trapped OLED light. Hence, in an alternative embodiment illustrated in FIG. 8B, the matrix 74 is coated in a thinner layer that is approximately as thick as, or thinner than, the size of the light-scattering particles 70. In this embodiment, the light-scattering particles 70 extend into the low-index medium 18, maintaining the optical refractive difference and enhancing the light-extraction effectiveness of the layer 23. In the embodiments of FIGS. 8A and 8B, the matrix 74 serves as a useful medium for carrying the color-conversion materials 72 and an aid to the intermixing of the color-conversion materials 72 with the light-scattering particles 70 by capillary action. In an alternative embodiment illustrated in FIG. 8C, no matrix 74 is employed and color-conversion materials 72 are dispersed in, for example, a solvent or gas using coating methods described above, that distributes the color-conversion materials 72 over and between the light-scattering particles 70 to form integral layer 23. To aid adhesion, an adhesive, for example urethane, may be employed with the light-scattering particles 70 or color-conversion material 72. In this embodiment, the optical index difference and light extraction effectiveness is even greater than in the previous embodiment. Moreover, frequency-converted light cannot be trapped in the matrix 74 since, in this embodiment, no such matrix is provided.

A combined scattering and color-conversion layer 23 may also be employed adjacent to the color filter layer 40 (not shown). In this case, trapped light in the cover 20, color filter layer 40, and color-conversion layer 42 may be extracted from the device, but some loss of sharpness may result due to the distance that scattered light may travel in the cover 20 adjacent to the color filters 40.

The scattering layer 22 is typically adjacent to and in contact with, or close to, an electrode to defeat total internal reflection in the organic layers 14 and transparent electrode 16. According to an embodiment of the present invention, light emitted from the organic layers 14 can waveguide along the organic layers 14 and electrode 16 combined, since the organic layers 14 have a refractive index lower than that of the transparent electrode 16 and electrode 12 is reflective. The scattering layer 22 or surface disrupts the total internal reflection of light in the combined layers 14 and 16 and redirects some portion of the light out of the combined layers 14 and 16. To facilitate this effect, the transparent low-index gap 18 should not itself scatter light, and should be as transparent as possible. The transparent low-index gap 18 is preferably at least one micron thick to ensure that emitted light properly propagates through the transparent low-index gap and is transmitted through the cover 20.

Whenever light crosses an interface between two layers of differing index (except for the case of total internal reflection), a portion of the light is reflected and another portion is refracted. Unwanted reflections can be reduced by the application of standard thin anti-reflection layers. Use of anti-reflection layers may be particularly useful on both sides of the encapsulating cover 20.

The scattering layer 22 or integral scattering layer 23 can employ a variety of materials. For example, randomly located particles of titanium dioxide may be employed in a matrix of polymeric material. Alternatively, a more structured arrangement employing ITO, silicon oxides, or silicon nitrides may be used. In a further embodiment, the refractive materials may be incorporated into the electrode itself so that the electrode is a scattering layer. Shapes of refractive elements may be cylindrical, rectangular, or spherical, but it is understood that the shape is not limited thereto. The difference in refractive indices between materials in the scattering layer 22 may be, for example, from 0.3 to 3, and a large difference is generally desired. The thickness of the scattering layer, or size of features in, or on the surface of, a scattering layer may be, for example, 0.03 to 50 µm. It is generally preferred to avoid diffractive effects in the scattering layer. Such effects may be avoided, for example, by locating features randomly or by ensuring that the sizes or distribution of the refractive elements are not the same as the wavelength of the color of light emitted by the device from the light-emitting area.

The scattering layer 22 should be selected to get the light out of the OLED as quickly as possible so as to reduce the opportunities for re-absorption by the various layers of the OLED device. The total diffuse transmittance of the same layer coated on a glass support accordingly should be high (preferably greater than 80%). Further, the absorption of the scattering layer should be as low as possible (preferably less than 5%, and ideally 0%).

Materials of the light scattering layer 22 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. The scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide.

Conventional lithographic means can be used to create the scattering layer using, for example, photo-resist, mask exposures, and etching as known in the art. Alternatively, coating may be employed in which a liquid, for example polymer having a dispersion of titanium dioxide, may form a scattering layer 22.

Color-conversion materials that may be employed in the present invention are themselves also well-known. Such materials are typically fluorescent and/or phosphorescent materials that absorb light at higher frequencies (shorter wavelengths, e.g. blue) and emit light at different and lower frequencies (longer wavelengths, e.g. green or red). Such materials that may be employed for use in OLED devices in accordance with the present invention are disclosed, e.g., in U.S. Pat. Nos. 5,126,214, 5,294,870, and 6,137,459, patent publications US2005/0057176, and US2005/0057177, and specifically may include useful fluorescent emissive materials such as polycyclic aromatic compounds as described in I. B. Berlman, "Handbook of Fluorescence Spectra of Aromatic Molecules," Academic Press, New York, 1971 and EP 1 009 041, the disclosures of which are incorporated by reference herein.

Color-conversion materials comprising tertiary aromatic amines with more than two amine groups that can be used include oligomeric materials. Another class of useful emissive materials (for host or dopants) include aromatic tertiary amines, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or an oligomeric arylamine. Exemplary monomeric triarylamines are illustrated by Klupfel, et al. U.S. Pat. No. 3,180,730. Other suitable triarylamines substituted with one or more vinyl radicals and/or comprising at least one active hydrogen containing group are disclosed by Brantley, et al. U.S. Pat. Nos. 3,567,450 and 3,658,520. A more preferred class of aromatic tertiary amines are those which include at least two aromatic tertiary amine moieties as described in U.S. Pat. Nos. 4,720,432 and 5,061,569.

The emissive material can also be a polymeric material, a blend of two or more polymeric materials, or a doped polymer or polymer blend. The emissive material can also include more than one nonpolymeric and polymeric materials with or without dopants. Nonpolymeric dopants can be molecularly dispersed into the polymeric host, or the dopant could be added by copolymerizing a minor constituent into the host polymer. Typical polymeric materials include, but are not limited to, substituted and unsubstituted poly(p-phenylenevinylene) (PPV) derivatives, substituted and unsubstituted poly (p-phenylene) (PPP) derivatives, substituted and unsubstituted polyfluorene (PF) derivatives, substituted and unsubstituted poly(p-pyridine), substituted and unsubstituted poly(p-pyridalvinylene) derivatives, and substituted, unsubstituted poly(p-phenylene) ladder and step-ladder polymers, and copolymers thereof as taught by Diaz-Garcia, et al. in U.S. Pat. No. 5,881,083 and references therein. The substituents include but are not limited to alkyls, cycloalkyls, alkenyls, aryls, heteroaryls, alkoxy, aryloxys, amino, nitro, thio, halo, hydroxy, and cyano. Typical polymers are poly(p-phenylene vinylene), dialkyl-, diaryl-, diamino-, or dialkoxy-substituted PPV, mono alkyl-, mono alkoxy-substituted PPV, mono aryl-substituted PPV, 9,9'-dialkyl or diaryl-substituted PF, 9,9'-mono alky-mono aryl substituted PF, 9-mono alky or aryl substituted PF, PPP, dialkyl-, diamino-, diaryl-, or dialkoxy-substituted PPP, mono alkyl-, aryl-, alkoxy-, or amino-substituted PPP. In addition, polymeric materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS. The organic materials mentioned above are suitably deposited from a solvent with an optional binder to improve film formation.

Besides using organic fluorescent dyes as the down converters, recent results point to the viability of using inorganic quantum dots as the fluorescent compounds in the color converter layer. For example, colloidal CdSe/CdS heterostructure quantum dots have demonstrated quantum yields above 80%, A. P. Alivisatos, MRS Bulletin 18 (1998). The solid matrix containing the organic or inorganic fluorescent material should be transparent to visible wavelength light and capable of being deposited by inexpensive processes. Preferred solid matrices are transparent plastics, such as polyvinyl acetate or PMMA. In doping the matrices with the organic dyes, the dye concentration needs to be kept just below where concentration quenching begins to occur. As such, the doping concentration would be in the 0.5-2% range for DCJTB and Coumarin 545T.

One problem that may be encountered with scattering layers is that the electrodes may tend to fail open at sharp edges associated with the scattering elements in the layer 22. Although the scattering layer may be planarized, typically such operations do not form a perfectly smooth, defect-free surface. To reduce the possibility of shorts between the electrodes 12 and 16, a short-reduction layer may be employed between the electrodes. Such a layer is a thin layer of high-resistance material (for example having a through-thickness resistivity between $10^{-7}$ ohm-cm$^2$ to $10^3$ ohm-cm$^2$). Because the short-reduction layer is very thin, device current can pass between the electrodes through the device layers but leakage current through the shorts are much reduced. Such layers are described in US2005/0225234, filed Apr. 12, 2004, the disclosure of which is incorporated herein by reference.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

In particular, very thin layers of transparent encapsulating materials 24 may be deposited on the transparent electrode 16 to protect the OLED from environmental contamination such as water vapor or mechanical stress. In this case, the scattering layer 22 may be deposited over the layers of encapsulating materials. This structure has the advantage of protecting the electrode 16 during the deposition of the scattering layer 22. Preferably, the layers of transparent encapsulating material have a refractive index comparable to the first refractive index range of the transparent electrode 16 and/or organic layers 14, or is very thin (e.g., less than about 0.2 micron) so that wave guided light in the transparent electrode 16 and organic layers 14 will pass through the layers of transparent encapsulating material and be scattered by the scattering layer 22. In one useful embodiment, the protective layer 24 may include combinations of silicon oxides and nitrides to provide transparency, encapsulation, protection, and a suitable refractive index.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing neutral density filters over the display. Filters, polarizers, and anti-glare or anti-reflection coatings may be specifically provided over the cover or as part of the cover.

The present invention may also be practiced with either active- or passive-matrix OLED devices. It may also be employed in display devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 10 substrate
12 electrode
14 organic layer(s)
16 transparent electrode
18 low-index gap
20 cover
22 scattering layer
23, 23R, 23G, 23B integral scattering and color-conversion material layer
24 protective layer
30 thin-film transistors
32 planarization layer
34 planarization layer
40, 40A, 40B, 40C color filters
41 black matrix
43 black matrix
42, 42R, 42G, 42B color-conversion material
50, 50R, 50G, 50B light-emitting areas
60 adhesive
70 light-scattering particle
72 color-conversion material
74 transparent matrix
100 form OLED on substrate step
102 form scattering layer on OLED step
104 form black matrix on cover step
106 form color filter on cover step
108A form color-conversion layer
108B form color-conversion layer
110 align cover to substrate step
112 affix cover to substrate step

The invention claimed is:

1. A top-emitting OLED device, comprising:
one or more OLEDs formed on a substrate, the OLED including a first electrode formed over the substrate, one or more layers of light-emitting organic material formed over the first electrode, and a transparent second electrode formed over the one or more layers of light-emitting organic material;
a light-scattering layer formed over the one or more OLEDs for scattering light emitted by the one or more layers of light-emitting organic material;
a transparent cover having a first refractive index;
one or more color filters formed on the transparent cover;
a color-conversion material layer formed over the color filters, or formed over or integral with the light-scattering layer;
wherein the substrate is aligned and affixed to the transparent cover so that the locations of the color filters and color conversion material correspond to the location of the OLEDs, and the color-conversion material layer, color filters, and the light-scattering layer are between the cover and substrate, and a low-index gap having a second refractive index less than the first refractive index is formed between the light-scattering layer and the color filters, with no light-scattering layer being positioned between the color conversion material layer and the low-index gap and
black-matrix material disposed between the one or more color filters, wherein the black-matrix material is thicker than the color filters and is aligned with non-emissive areas between the OLEDs formed on the substrate and serves as a spacer forming the low-index gap.

2. The OLED device of claim 1 further comprising black-matrix material within at least one emissive areas of at least one OLED.

* * * * *